(12) United States Patent
Kim et al.

(10) Patent No.: US 8,533,405 B2
(45) Date of Patent: *Sep. 10, 2013

(54) NONVOLATILE SEMICONDUCTOR MEMORY DEVICE

(75) Inventors: Jin-Ki Kim, Kanata (CA); Daniel Albert Hammond, Nepean (CA)

(73) Assignee: MOSAID Technologies Incorporated, Ottawa (CA)

( * ) Notice: Subject to any disclaimer, the term of this patent is extended or adjusted under 35 U.S.C. 154(b) by 239 days.

This patent is subject to a terminal disclaimer.

(21) Appl. No.: 12/812,500

(22) PCT Filed: Dec. 16, 2008

(86) PCT No.: PCT/CA2008/002206
§ 371 (c)(1),
(2), (4) Date: Jul. 12, 2010

(87) PCT Pub. No.: WO2009/089612
PCT Pub. Date: Jul. 23, 2009

(65) Prior Publication Data
US 2010/0306482 A1   Dec. 2, 2010

Related U.S. Application Data

(60) Provisional application No. 61/021,662, filed on Jan. 17, 2008.

(51) Int. Cl.
*G06F 12/00* (2006.01)
*G11C 11/34* (2006.01)
*G11C 8/00* (2006.01)

(52) U.S. Cl.
USPC .............. 711/154; 711/E12.084; 365/185.11; 365/230.03

(58) Field of Classification Search
USPC ........................ 711/154; 365/185.11, 230.03
See application file for complete search history.

(56) References Cited

U.S. PATENT DOCUMENTS 3,906,458 A   9/1975   Ehlers
5,093,805 A   3/1992   Singh
(Continued)

FOREIGN PATENT DOCUMENTS

CN   1393812   1/2003
EP   1207471   5/2002
(Continued)

OTHER PUBLICATIONS

Imamiya, K et al, A 125-MM2 1-GB NAND Flash Memory With 10-Mbyte/s Program Speed, IEEE Journal of Solid-State Circuits, vol. 37, No. 11, 1493-1501, Nov. 1, 2002.
(Continued)

*Primary Examiner* — Reginald Bragdon
*Assistant Examiner* — Aracelis Ruiz
(74) *Attorney, Agent, or Firm* — Daniel Hammond

(57) ABSTRACT

A nonvolatile memory having a non-power of two memory capacity is disclosed. The nonvolatile memory device includes at least one plane. The plane includes a plurality of blocks with each of the blocks divided into a number of pages and each of the blocks defined along a first dimension by a first number of memory cells for storing data, and along a second dimension of by a second number of memory cells for storing data. The nonvolatile memory has a non-power of two capacity proportionally related to a total number of memory cells in said plane. The nonvolatile memory also includes a plurality of row decoders. An at least substantially one-to-one relationship exists, in the memory device, for number of row decoders to number of pages. Each of the row decoders is configured to facilitate a read operation on an associated page of the memory device.

19 Claims, 13 Drawing Sheets

(56) References Cited

U.S. PATENT DOCUMENTS

| | | | |
|---|---|---|---|
| 5,220,518 | A | 6/1993 | Haq |
| 5,854,763 | A | 12/1998 | Gillingham et al. |
| 6,480,943 | B1 * | 11/2002 | Douglas et al. ............... 711/157 |
| 6,816,407 | B2 | 11/2004 | Rolandi |
| 6,965,523 | B2 | 11/2005 | Rolandi |
| 7,102,671 | B1 | 9/2006 | Asnaashari |
| 7,313,022 | B2 | 12/2007 | Takeuchi et al. |
| 2004/0016975 | A1 | 1/2004 | Yang et al. |
| 2004/0125666 | A1 * | 7/2004 | Lee et al. ..................... 365/200 |
| 2005/0105335 | A1 | 5/2005 | Sugimae et al. |
| 2005/0172086 | A1 | 8/2005 | Kawai |
| 2007/0201279 | A1 | 8/2007 | Nakamura et al. |
| 2007/0206419 | A1 | 9/2007 | Makino |
| 2007/0246807 | A1 | 10/2007 | Hara et al. |
| 2008/0133824 | A1 | 6/2008 | Kim |
| 2009/0046512 | A1 | 2/2009 | Halloush et al. |
| 2009/0204747 | A1 | 8/2009 | Lavan et al. |

FOREIGN PATENT DOCUMENTS

| | | |
|---|---|---|
| JP | 01282796 | 11/1989 |
| JP | 03105794 | 5/1991 |
| JP | 04132087 | 5/1992 |
| JP | 10124381 | 5/1998 |
| JP | 11161717 | 6/1999 |
| JP | 2001143480 | 5/2001 |
| JP | 2002501275 | 1/2002 |
| JP | 2002329396 | 11/2002 |
| JP | 2003045191 | 2/2003 |
| JP | 2003123486 | 4/2003 |
| JP | 2003203494 | 7/2003 |
| JP | 2003263892 | 9/2003 |
| JP | 2004063074 | 2/2004 |
| JP | 2004526239 | 8/2004 |
| JP | 2005100538 | 4/2005 |
| JP | 2005216434 | 8/2005 |
| JP | 2005533369 | 11/2005 |
| JP | 2006252695 | 9/2006 |
| JP | 2006252747 | 9/2006 |
| JP | 2007018499 | 1/2007 |
| JP | 2007087571 | 4/2007 |
| JP | 2007242735 | 9/2007 |
| JP | 2008535137 | 8/2008 |
| WO | 9935649 | 7/1999 |
| WO | 02067269 | 8/2002 |
| WO | 03085672 | 10/2003 |
| WO | 2006107409 | 10/2006 |

OTHER PUBLICATIONS

Lee, June et al, A 90-nm CMOS 1.8-V 2-GB NAND Flash Memory for Mass Storage Applications, IEEE Journal of Solid-State Circuits, vol. 38, No. 11, 1934-1942, Nov. 1, 2003.

Takeuchi, K. et al, A 56nm CMOS 99MM2 8GB Multi-Level NAND Flash Memory With 10MB/s Program Throughput,Solid-State Circuits, 2006 IEEE International Conference Digest of Technical Papers, Seesion 7, ISBN:1-4244-0079-1, 507-516, Feb. 6, 2006.

2G×8Bit NAND Flash Memory, K9GAG08UXM; K9GAG08U0M, 1-48, Apr. 12, 2006.

16 Gbit (2G×8Bit) CMOS NAND E2PROM (Multi-Level-Cell), TC58NVG4D1DTG00, 1-64, Nov. 9, 2006.

Choi, Young, 16-Gbit MLC NAND Flash Weighs in, eeetimes.com, http://www.eetimes.com/showArticle.jhtmlarticleID=201200825, 1-3, Jul. 30, 2007.

Saito, S., U3 support USB flash memory: capable of carrying around applications!; Broadband Watch, Impress Watch Corporation; Japan; http://bb.watch.impress.co.jp/cda/items/14921.html, 1 pg, Aug. 2, 2006.

Sandisk, a 48MB CF card and a $99 card reader; Sandisk; PC Watch; http://pc.watch.impress.co.jp/docs/article/980217/sandisk.htm, 1 pg, Feb. 17, 1998.

* cited by examiner

NONVOLATILE SEMICONDUCTOR MEMORY DEVICE

CROSS-REFERENCE TO RELATED APPLICATIONS

This is a U.S. National Phase application corresponding to International Patent Application No. PCT/CA2008/002206 filed Dec. 16, 2008, published on Jul. 23, 2009 in the English language and claiming the benefit of U.S. patent application Ser. No. 12/042,551 filed Mar. 5, 2008 and also claiming the benefit of U.S. Provisional Patent Application No. 61/021,662 filed Jan. 17, 2008.

BACKGROUND OF THE DISCLOSURE

Today, many electronic devices include memory systems to store information. For example, some memory systems store digitized audio or video information for playback by a respective media player. Other memory systems store software and related information to carry out different types of processing functions. Also, some types of memory systems such as, for example, Dynamic Random Access Memory (DRAM) systems and Static Random Access Memory (SRAM) systems are volatile memory systems in that stored data is not preserved when the power is off, whereas other types of memory systems such as, for example, NAND flash memory systems and NOR flash memory systems are nonvolatile memory systems in that stored data is preserved when the power is off.

Typically the memory capacity of a memory system, regardless of whether the system is "volatile" or "nonvolatile", is doubled for every generation because of the nature of binary address bit structure in computing systems. Amongst those skilled in the art, it is commonly understood that doubled memory capacity (power of two memory capacity) is a requirement that should be complied with if it is used in a main memory system. Furthermore, although there have been some previous proposals for non-power of two memory capacity in a volatile memory system, at least in the context of nonvolatile memory systems there apparently does not currently exist any practical way of producing memory systems having non-power of two memory capacity.

It would of course be useful to be able to produce a nonvolatile memory system having non-power of two memory capacity. In this regards, one problem with doubling memory capacity without scaling down the process technology is that the associated circuits and components of larger size can usually no longer fit within the same package because of physical constraints such as, for example, physical size increase might be limited to increase in one dimension and the needed increase in size could be outside of definitive limits for any potential increase in size. Furthermore, changing the package may not be an option because industry adopts standard packages such as, for example 48-pin TSOP-1. Thus, the impact of switching from a standard package to a non-standard package may, in some cases, be as consequential as having to redesign the entire printed circuit board.

Given the problems posed by increasing physical size while staying within the same package, scaling down the process technology is the remaining alternative option that is considered; however scaling down the process technology is a huge investment. In many circumstances, it would be substantially more cost feasible to increase memory capacity without having to scale down the process technology.

SUMMARY

It is an object of the invention to provide an improved nonvolatile memory.

According to one aspect of the invention, there is provided a nonvolatile memory device that includes at least one plane. The plane includes a plurality of blocks with each of the blocks divided into a number of pages and each of the blocks defined along a first dimension by a first number of memory cells for storing data, and along a second dimension of by a second number of memory cells for storing data. The nonvolatile memory has a non-power of two capacity proportionally related to a total number of memory cells in a data section of the plane. The nonvolatile memory also includes a plurality of row decoders. An at least substantially one-to-one relationship exists, in the memory device, for number of row decoders to number of pages. Each of the row decoders is configured to facilitate a read operation on an associated page of the memory device.

According to another aspect of the invention, there is provided a memory system that includes at least one nonvolatile memory device that has at least one plane. The plane includes a plurality of blocks, with each of the blocks divided into a number of pages. Each of the blocks are defined along a first dimension by a first number of memory cells for storing data, and along a second dimension of by a second number of memory cells for storing data. The memory device has a non-power of two capacity proportionally related to a total number of memory cells in a data section of the plane. A controller is in communication with the memory device. The controller includes storage and a management module. The storage stores a map table. The management module is configured to access the map table to carry out translation of logical addresses to physical addresses. Invalid physical addresses attributable to the non-power of two capacity of the memory device are mapped out in the map table.

According to yet another aspect of the invention, there is provided a method of filling a memory controller table with data. The table is stored in a random access memory of a memory controller. The memory controller is in communication with at least one nonvolatile memory device having at least one memory cell array storing the data for management functions of the memory controller. The at least one memory cell array has a non-power of two capacity. The method includes retrieving the data from the at least one memory cell array. The method also includes processing the data in the memory controller to determine invalid physical addresses attributable to the non-power of two capacity of the at least one memory cell array. The method also includes modifying the memory controller table to map out the invalid physical addresses.

According to yet another aspect of the invention, there is provided a network that is capable of sending and receiving communications that are transmitted through the Internet. The network includes at least one server and at least one data store in communication with the server. The server is capable of receiving data which includes information corresponding to an order for at least one item, the at least one item includes at least one nonvolatile memory chip having a non-power of two capacity. The server is also capable of processing the data to make the data suitable for storage in the at least one data store. The server is also capable of generating an electronic notification that is adapted for transmission through the Internet in order to provide confirmation of order receipt to a customer.

Thus, an improved nonvolatile memory has been provided.

BRIEF DESCRIPTION OF THE DRAWINGS

Reference will now be made, by way of example, to the accompanying drawings.

Similar or the same reference numerals may have been used in different figures to denote similar components.

DETAILED DESCRIPTION OF EXAMPLE EMBODIMENTS

In many of the electronic devices, the memory systems often comprise a controller and one or more corresponding flash memory devices. The controller typically includes circuitry configured to generate signals to the memory devices for storage and retrieval of data from the flash memory devices.

Figure 1:
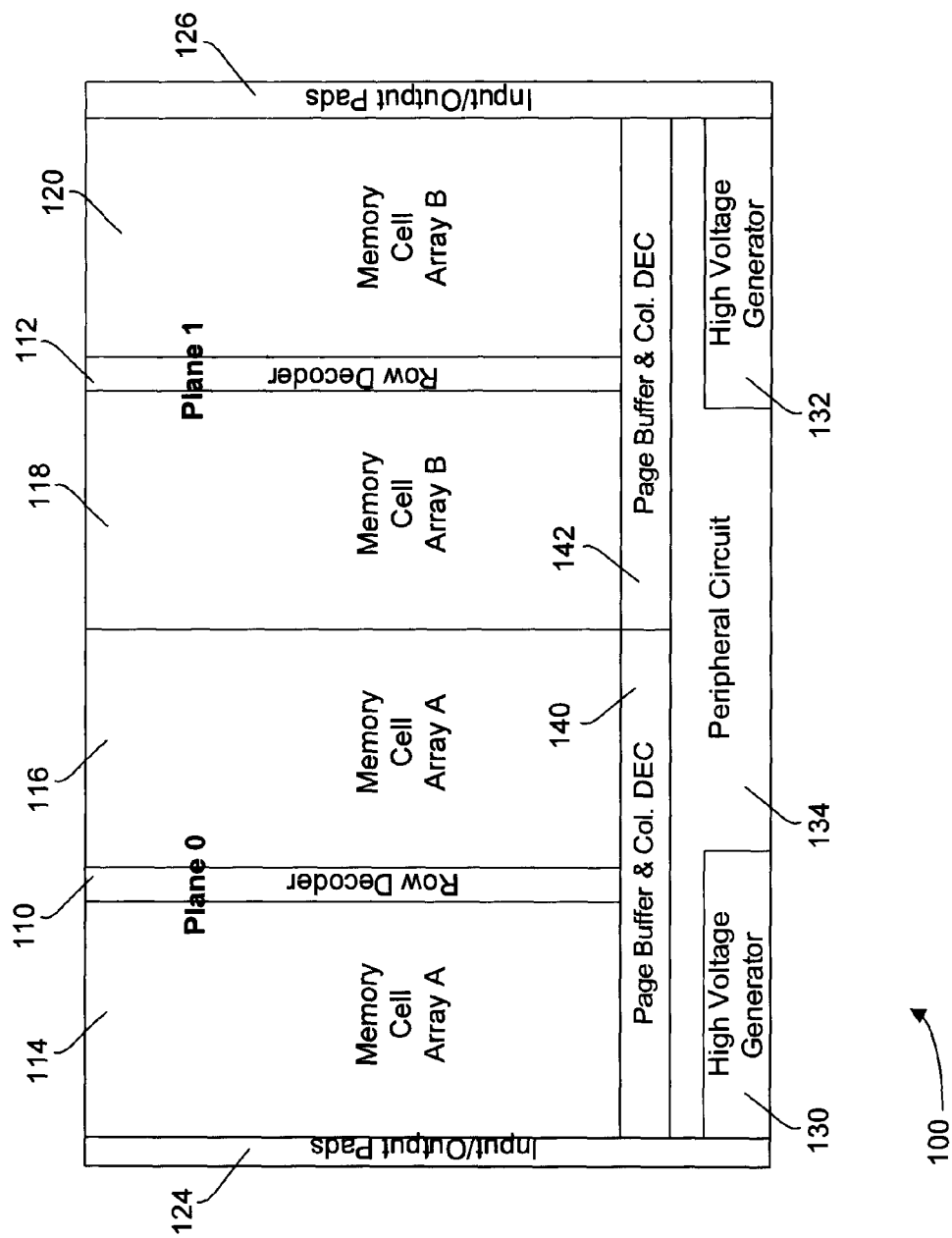
FIG. 1 is a block diagram of an example NAND flash chip floor plan.

Referring now to the drawings, FIG. 1 is a block diagram of an example NAND flash chip floor plan 100 illustrating the actual placement of major components within the chip area of the flash memory device. In the floor plan 100, two row decoder areas 110 and 112 extend between adjacent memory cell array areas 114 and 116, and 118 and 120 respectively. With respect to row decoder areas 110 and 112, it is within these areas that the row decoders of the flash memory device can be found. With respect to memory cell array areas 114, 116, 118 and 120, it is within these areas that the memory cell arrays of the flash memory device can be found.

Extending along width-wise edges of the floor plan 100 are input/output pad areas 124 and 126, and extending along length-wise edges of the floor plan 100 are high voltage generator areas 130 and 132, and peripheral circuit area 134.

With respect to input/output pad areas 124 and 126, it is within these areas that the input/output pads of the flash memory device can be found. With respect to high voltage generator areas 130 and 132, it is within these areas that one finds the high voltage generators of the flash memory device such as, for example, charge pumps. With respect to peripheral circuit area 134, it is within this area that other circuitry important for device operation such as, for example, control circuitry can be found. Also, adjacent peripheral circuit area 134 are additional circuit areas 140 and 142. It is within these areas that the page buffers and column decoders of the flash memory device can be found.

Those skilled in the art will appreciate that chip floor plans for nonvolatile memories will vary, within working constraints and specifications, depending on the choice of the designer. For example, Toshiba Corporation produces some two plane, nonvolatile memory devices with a row decoder area extending between two relatively adjacent edges of the areas of the planes. Comparing the floor plan of a the Toshiba memory device to the floor plan 100, one might find the following differences (non-exhaustive list): the row decoder area extends down the center of the floor plan rather than having two spaced-apart row decoder areas, only a single high voltage generator area, input/output pad areas which extend along the edge that is adjacent the peripheral circuit area.

Figure 2:
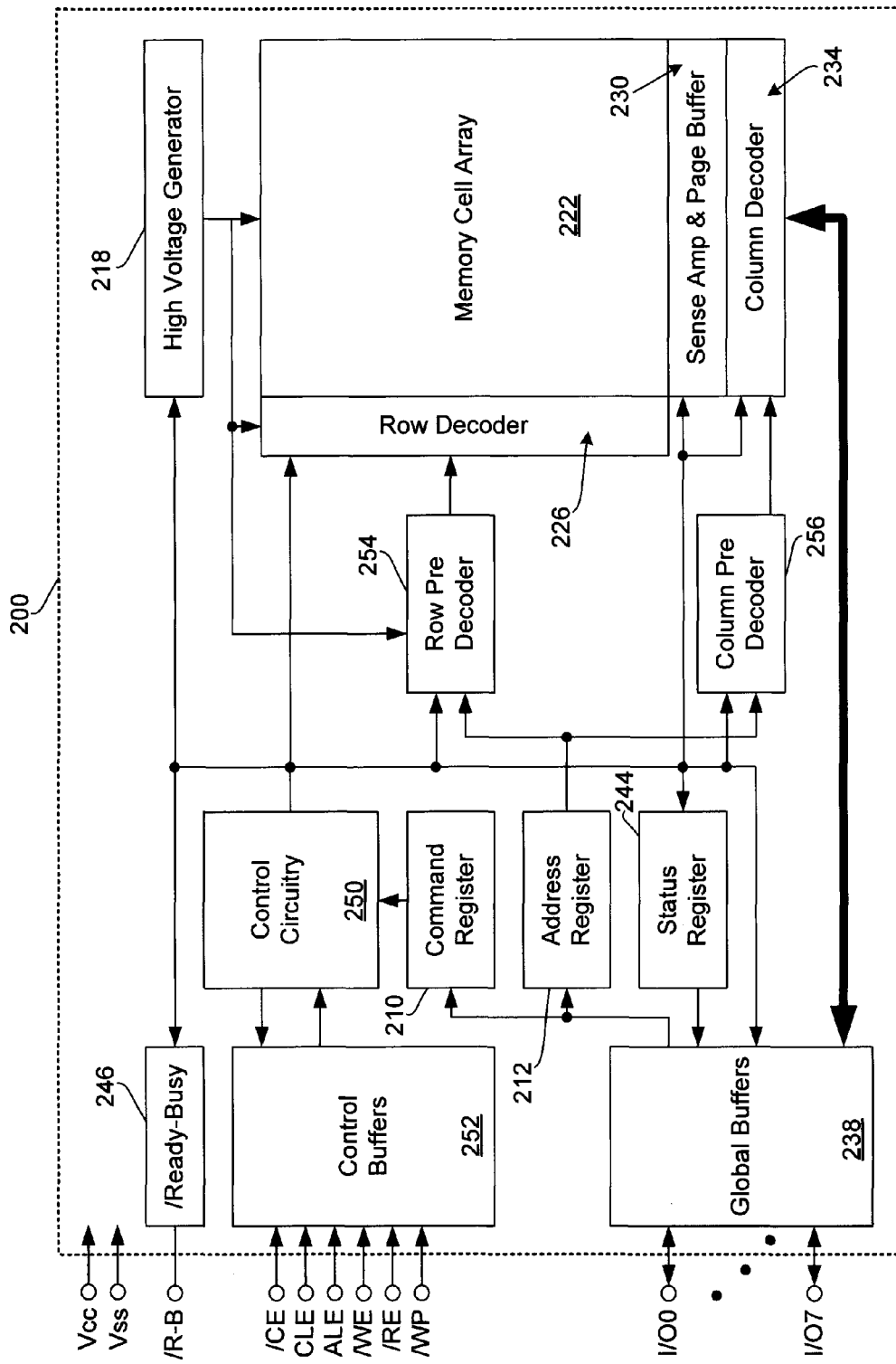
FIG. 2 is a functional block diagram of an example NAND flash memory.

Referring now to FIG. 2, there is shown a functional block diagram of an example NAND flash memory device 200. The device 200 has common input and output port (I/O pins 0 to 7) for transferring address, command and input/output data to and from the device 200. The illustrated device 200 also includes a Command Latch Enable (CLE) port. A CLE input signal to the port is used to control loading of the operation mode command into an internal command register 210. The command is latched into the command register 210 from the I/O port on the rising edge of the /WE signal while CLE is logic high. The illustrated device 200 also includes an Address Latch Enable (ALE) port. The ALE signal to the port is used to control loading address information into an internal address register 212. Address information is latched into the address register 212 from the I/O port on the rising edge of the /WE signal while ALE is logic high. Along with an Address Latch Enable (ALE) port, the illustrated device 200 also includes a Chip Enable (/CE) port. In particular, the device 200 goes into a low-power Standby mode when /CE goes logic high when the device 200 is in a Ready state. By contrast, the /CE signal is ignored when the device 200 is in a Busy state (i.e. /R-B is logic low), such as during a Program or Erase or Read operation, and the device 200 will not enter the Standby mode even if the /CE input goes logic high.

The illustrated device 200 also includes ports for enabling write and read operations. A Write Enable (/WE) port receives a /WE signal, which is used to control the acquisition of data from the I/O port. A Read Enable (/RE) port receives an RE signal for controlling serial data output. Data is available after the falling edge of /RE. An internal column address counter [not explicitly shown] is also incremented (Address=Address+1) on this falling edge.

The illustrated device 200 also includes a Write Protect (/WP) port. The /WP port receives a /WP signal that is used to protect the device 200 from accidental programming or erasing. An internal voltage regulator (high voltage generator 218) is reset when /WP is logic low. The /WP signal is usually used for protecting the data during a power-on/off sequence when input signals are invalid. Along with a Write Protect (/WP) port, the illustrated device 200 also includes a Ready/Busy (/R-B) port. The /R-B port comprises an open drain pin, and the transmitted output signal is used to indicate the operating condition of the device. The /R-B signal is in a Busy state (/R-B is logic low) during the Program, Erase and Read operations and will return to a Ready state (/R-B is logic high) after completion of the operation.

Still with reference to FIG. 2, the memory core of the illustrated device 200 comprises memory cell array 222, row decoder 226, sense amplifier and page buffer 230, and column decoder 234. With respect to the row decoder 226, a page for either a read or program operation is selected by it. For an erase operation, the row decoder 226 selects a block, which is a subdivision of the memory cell array 222 defined along a first dimension by a first number of memory cells that store data, and along a second dimension of by a second number of other memory cells. Also, it will be understood that, in the context of flash and other similar nonvolatile memories, a block is a larger subdivision of the memory cell array 222 than a page. In terms of subdivision hierarchy, a plane of a memory device includes a plurality of blocks with each of the blocks divided into a number of pages.

Continuing on with the description of operations, with respect to the data of a page that is selected by the row decoder 226 in connection with a read operation, the data is sensed and latched into the sense amplifier and page buffer 230 during the read operation. After that, the data stored in the page buffer and is sequentially read out through the column decoder 234 and global buffers 238. The global buffers 238 temporarily hold and buffer input and output data via common I/O pins. During programming, the input data from the global buffers 238 are sequentially loaded into the page buffer via the column decoder 234. The input data latched in the page buffer are finally programmed into the selected page.

Electrically connected to the memory cell array 222, the high voltage generator 218 provides necessary high voltages and reference voltages during read, program and erase operations. To track device status during read, program or erase operations, the illustrated device 200 includes a status register 244. Also, /Read-Busy (/R-B) circuitry 246 and a connected /R-B pin together provide another indicator for device status. In at least some examples, the /R-B circuitry 246 includes an open drain transistor [not explicitly shown].

The illustrated device 200 also includes control circuitry 250 which, in at least some examples, is a central unit. The control circuitry 250 enables control of the device 200 during various operating modes. In electrical communication with the control circuitry 250 are control buffers 252 which act as buffers for the control circuitry 250.

The illustrated device 200 also includes a row pre decoder 254 and a column pre decoder 256. The row pre decoder 254 is intermediate the address register 212 and the row decoder 226. The row pre decoder 254 transfers, to the row decoder 226, multiplexed row addresses stored in the address register 212. The column pre decoder 256 is intermediate the address register 212 and the column decoder 234. The column pre decoder 256 transfers, to the column decoder 234, multiplexed column addresses stored in the address register 212.

Figure 3:
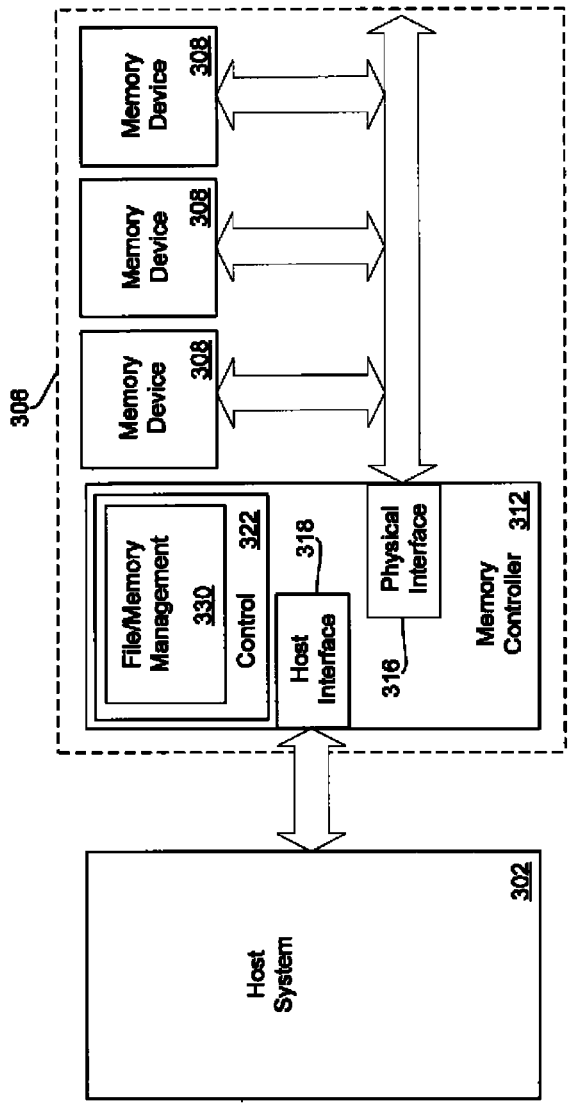
FIG. 3 is a block diagram of a host system and a memory system, the memory system including a number of memory devices which, in some examples, each correspond to the flash memory shown in FIG. 2.

Reference will now be made to FIG. 3. FIG. 3 is a block diagram of a host system 302 and a memory system 306 which can communicate with each other. The memory system 306 includes a number of memory devices 308. In some examples, each of the memory devices 308 corresponds to the flash memory 200 shown in FIG. 2. In other examples, only some of the memory devices 308 correspond to the flash memory 200 shown in FIG. 2, and the remaining memory devices 308 are some other type (or types) of nonvolatile memory devices that can function within the memory system 306. In still other examples, none of the memory devices 308 correspond to the flash memory 200 shown in FIG. 2, and instead all of the memory devices 308 are some other type (or types) of nonvolatile memory devices that can function within the memory system 306.

The memory system 306 also includes a memory controller 312 shown as in accordance with some examples. The illustrated memory controller 312 includes a physical interface 316, a host interface 318, and a control module 322. The physical interface 316 enables the memory controller 312 to communicate with the memory devices 308, and it also enables the memory devices 308 to communicate with the memory controller 312. The host interface 318 enables the memory controller 312 to communicate with the host system 302, and it also enables the host system 302 to communicate with the memory controller 312. The illustrated host interface 318 is shown within the memory controller 312; however in alternative examples the host interface may be implemented as a separate device or internal to a system in communication with the memory controller 312.

Still with reference to FIG. 3, the illustrated control module 322 includes a file/memory management submodule 330. Among other possible functions, the file/memory management submodule 330 provides mapping of logical addresses to physical addresses, so that the physical addresses of requested data can be determined. The mapping may further include algorithms that distribute and redistribute data stored at the devices to improve performance or perform so called "wear-leveling" and, when required, ensuring that physical addresses corresponding to bad memory cells are not made available or used by the host system. This latter mapping aspect is commonly referred to as "mapping out", which in the context of example embodiments is not limited to bad memory cells being mapped out. In particular, at a later point in the present disclosure, there is a description of how this "mapping out" can play a role in the handling of invalid addresses in non-power of two capacity memory devices.

In at least some examples of the memory controller 312, the control module 322 may include the following submodules at least some of which will be seen to be components of the file/memory management submodule 330: an allocator, a cleaner and a static wear-leveler. The allocator handles translation of logical addresses to physical addresses in accordance with any one of known translation mechanisms that are understood by those skilled in the art, such as, for example, NAND Flash Translation Layer (NFTL). With respect to the cleaner, it handles garbage collection to reclaim pages of invalid data in a manner understood by those skilled in the art. With respect to the static wear-leveler, it handles wear-leveling, characterized by data redistribution carried out in a manner consistent with achieving the intended goal, which is to evenly distribute the number of erasings for each block (because of the limitation on the number of erasings for blocks). The motivation of static wear-leveling is to prevent any "cold" data (as contrasted with "hot" data) from staying at any block for a long period of time. It is to minimize the maximum erase-count difference of any two blocks so that the lifetime of flash memory may be extended.

Figure 4:
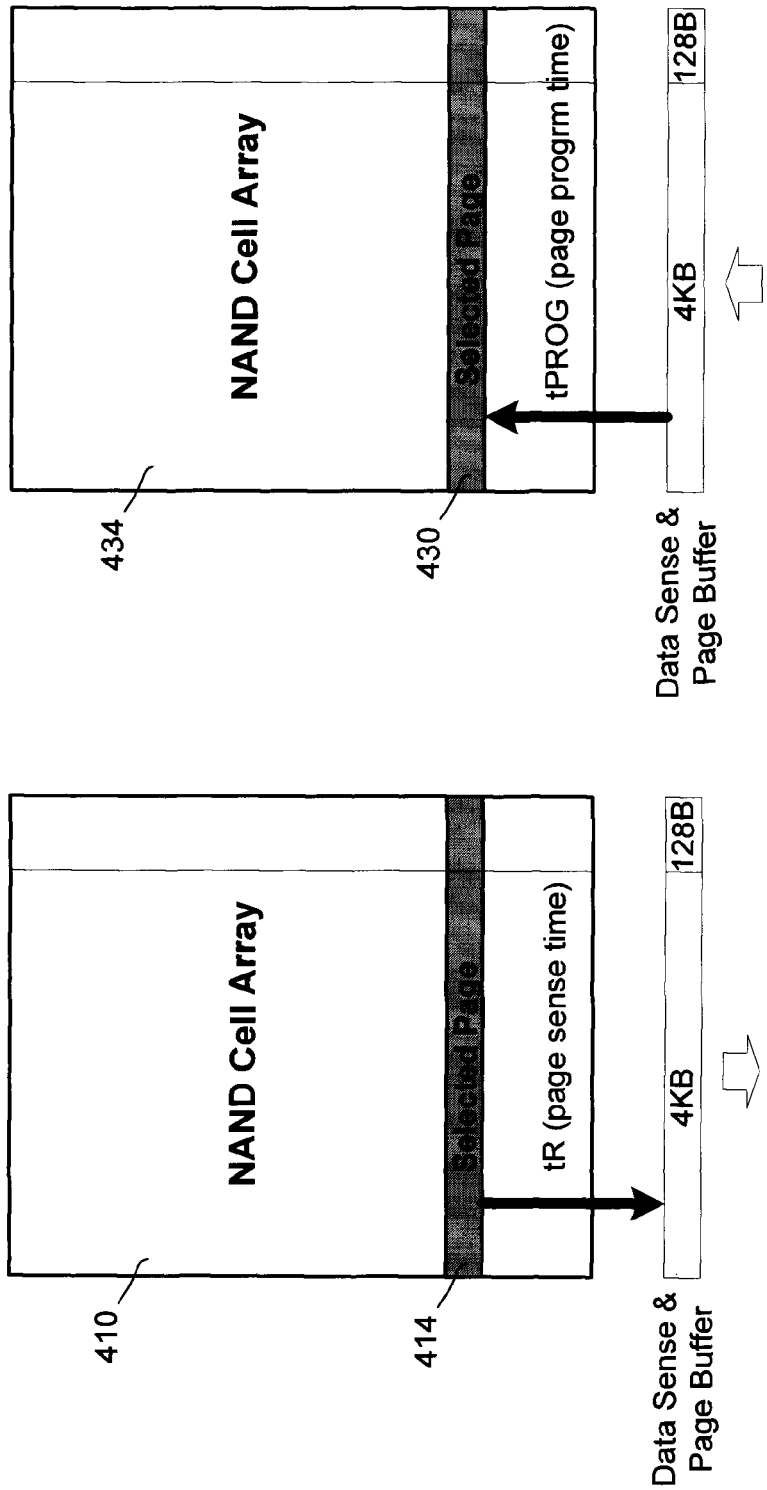
FIG. 4A is a block diagram illustrating a read operation in an example NAND flash device.
FIG. 4B is a block diagram illustrating a program operation in an example NAND flash device.

Reference will now be made to FIG. 4A. FIG. 4A is a block diagram illustrating a read operation in an example NAND flash device. Internal memory array 410 of the NAND flash device is accessed on a page basis (note example selected page 414). In the illustrated example of FIGS. 2 and 4A, the read operation starts after writing READ command followed by addresses via common I/O pins (I/O 0 to I/O 7) to the device 200. The sense amplifier and page buffer 230 senses and transfers the 4,224 bytes of data within the selected page 414 in less than tR (data transfer time from flash array to page buffer). Once the 4,224 bytes of data are sensed and transferred from the selected page 414 in the cell array 410 to the page buffer, the data in the page buffer can be sequentially read from the device 200. As shown in FIG. 4A, for every page of data there will be a spare field (in the illustrated example the spare field is 128 bytes; however in other examples the spare field could be any suitable number of bytes). The purpose of the spare fields is as follows: at power up of the memory system 306 and the memory controller 313 (FIG. 3) the control module 322 will want to get non-constant/variable information (for example, wear-leveling and address mapping related information) about the memory devices 308. It does this by dumping at least some of the data stored in the spare fields into SRAM storage [not explicitly shown] within the memory controller 312. Once the data from the spare fields is stored locally within the memory controller 312, the control module 322 can use the data to properly carry out its functions. For example, a map table within the SRAM storage is accessed in connection with the carrying out of logical to physical address translation.

In addition to the memory controller 312 being able to read from the spare fields, the memory controller 312 is also capable of updating data in the spare fields. FIG. 4B is a block diagram illustrating a program operation in an example NAND flash device. In connection with the program operation of the illustrated example, a PROGRAM command is followed by addresses and input data of 4,224 bytes, issued to the device 200 (FIG. 2) through common I/O pins (I/O0 to I/O7). The 4,224 bytes of data are transferred to the page buffer during input data loading cycles and finally programmed to a selected page 430 of cell array 434 in less than tPROG (page program time). As illustrated, the 4,224 bytes of data includes 128 bytes of spare field data, and furthermore the memory controller 312 (FIG. 3) is the originating generator (or originating modifier) of this additional data, such that in the case of FIG. 4B the spare field data is communicated from the memory controller 312 to the memory device 308, whereas in the case of FIG. 4A the spare field data is communicated from the memory device 308 to the memory controller 312.

Figure 5:
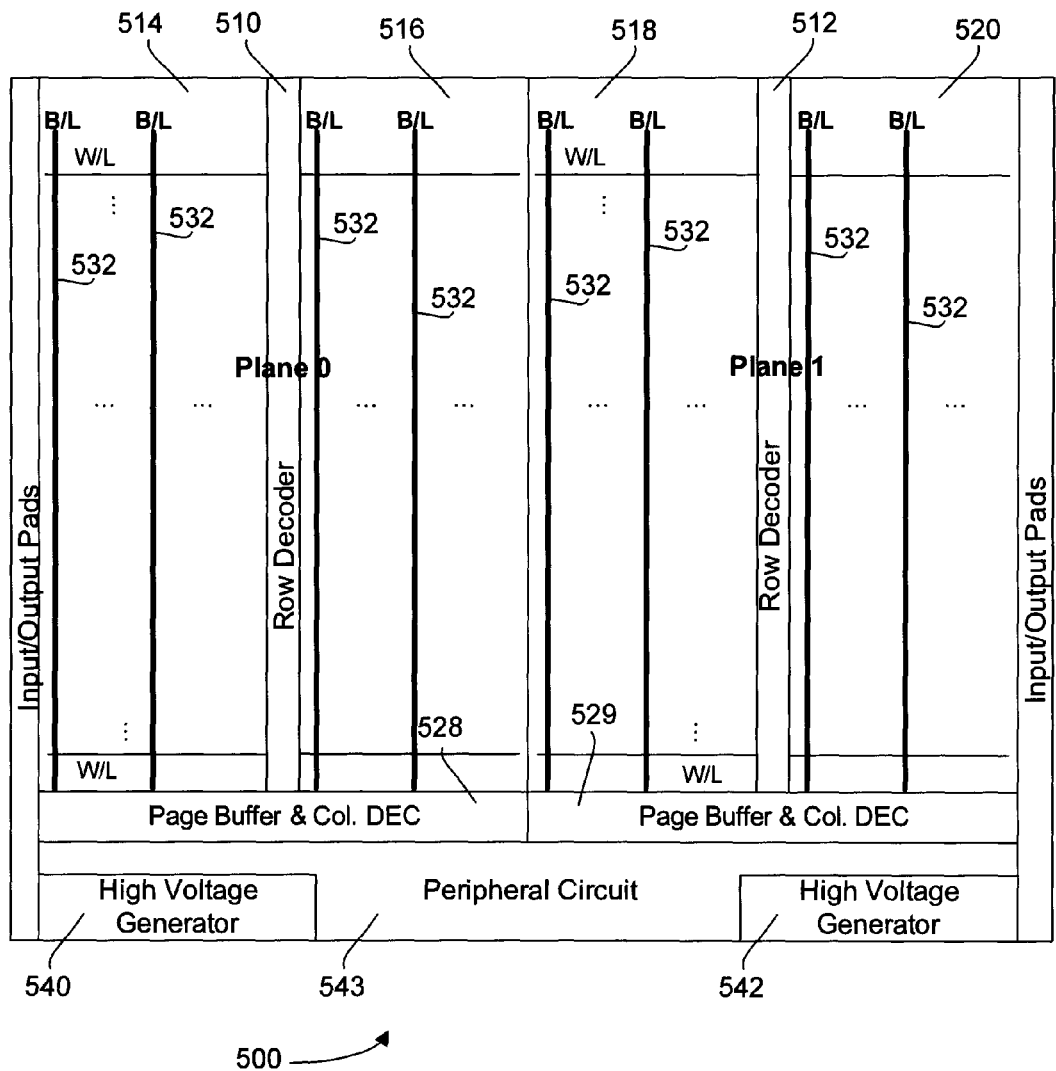
FIG. 5 is a block diagram of an example floor plan for a NAND flash chip fabricated in accordance with an example embodiment.

Reference will now be made to FIG. 5 which is a block diagram of an example floor plan 500 for a NAND flash chip fabricated in accordance with an example embodiment. In connection with FIG. 5, it will be seen that for ease of illustration some representative divisional units of the memory, such as planes and bit lines, have been shown, whereas other representative divisional units, such as pages and blocks, for example, have not been shown.

As was similarly explained in connection with FIG. 1, in the floor plan 500 of FIG. 5, two row decoder areas 510 and 512 extend between adjacent memory cell array areas 514 and 516, and 518 and 520 respectively. Also, extending along edges of the memory cell areas are elongate areas 528 and 529 within which can be found page buffers and column decoders of the flash memory device (as previously explained). Extending perpendicular to the lengths of the areas 528 and 529 are a plurality of significantly long bit lines 532. As will be appreciated by those skilled in the art, the bit lines 532 are typically electrically connected, in a distributively proportionate manner, to page buffers within the areas 528 and 529.

Because the bit lines 532 are significantly longer than bit lines that would otherwise be found in this memory device were it a power of two memory capacity device, correspondingly increased capacity is possible. In particular, it will be understood that longer bit lines facilitate fabrication of a device with a greater number of word lines, and hence a greater number blocks. For example, whereas each plane in a power of two memory capacity device might have say 2048 blocks (i.e. a binary number of blocks) each plane in a non-power of two memory capacity device having longer bit lines 532 might have say 2560 blocks (or some other suitable non-binary number of blocks).

It will be seen that an impact of fabrication with the longer bit lines 532 may be more efficient chip area usage. In particular, with respect to at least some example embodiments, various chip areas that are not a part of the memory cell arrays do not proportionally increase in size as the memory cell array areas 514, 516, 518 and 520 increase in size. In this regard, even though the bit lines 532 are significantly longer than the bit lines within the memory cell arrays shown in FIG. 1, the following areas shown in FIG. 5: high voltage generator areas 540 and 542, peripheral circuit area 543 and the areas 528 and 529, may be at least similar (if not the same) in size as compared to the corresponding areas shown in FIG. 1. For many applications, higher current on the $V_{cc}$ side may be expected, but this higher current should not be so sizable as to be of significant concern.

Figure 6:
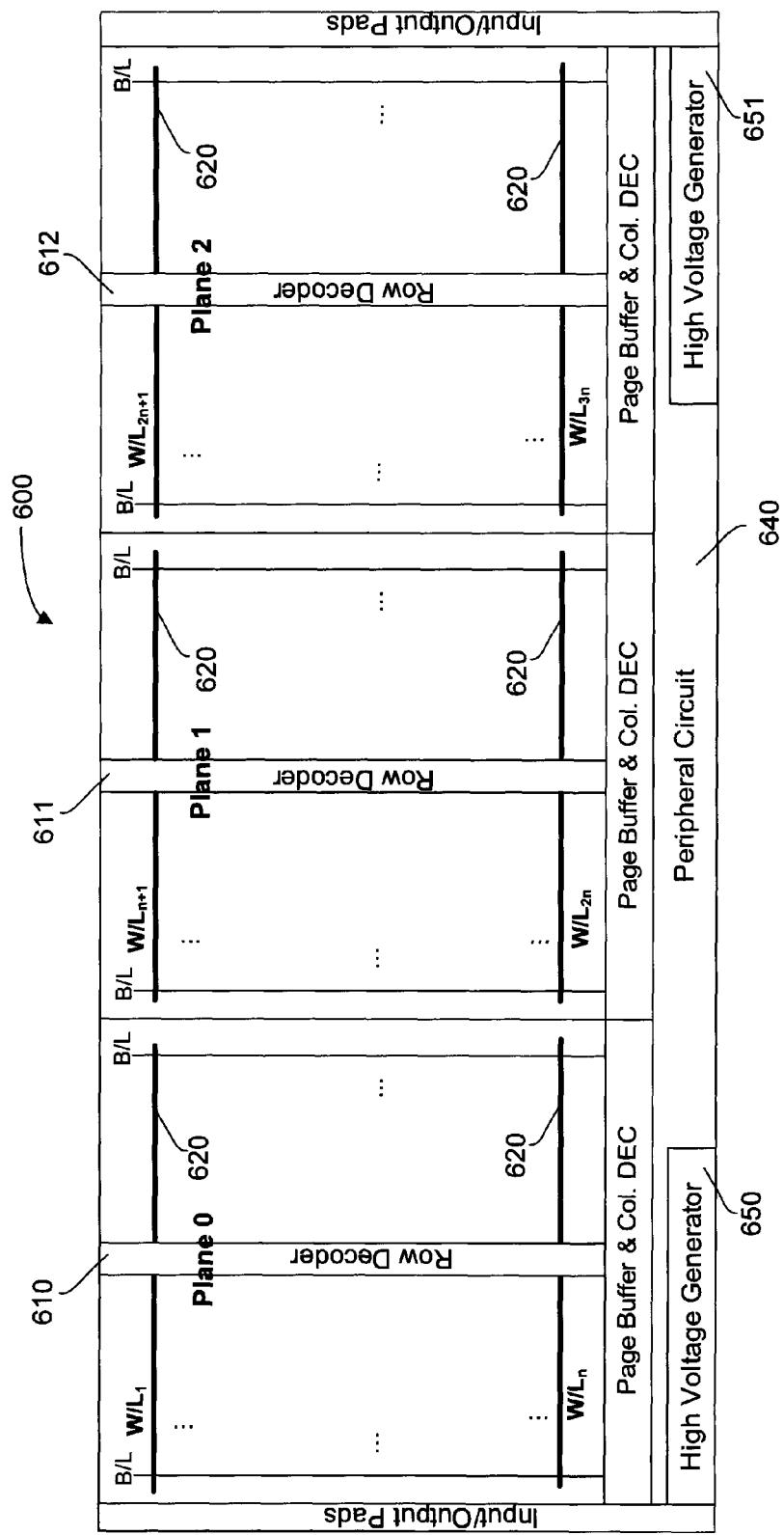
FIG. 6 is a block diagram of an example floor plan for a NAND flash chip fabricated in accordance with another example embodiment.

Reference will now be made to FIG. 6 which is a block diagram of an example floor plan 600 for a NAND flash chip fabricated in accordance with another example embodiment. In connection with FIG. 6, it will be seen that for ease of illustration some representative divisional units of the memory, such as planes and word lines, have been shown, whereas other representative divisional units, such as pages and blocks, for example, have not been shown.

It will be noted that in the illustrated example embodiment there are three row decoders 610-612, one for each of the planes labeled Plane 0, Plane 1 and Plane 2. Thus, for the example embodiment of FIG. 6 there is a non-power of two number of row decoders and planes (three) as contrasted with the NAND flash chip illustrated in FIG. 1, which has two row decoders and planes (i.e. a number which is a power of two). It will be understood that while the non-power of two number for the illustrated example embodiment is three, in other example embodiments the non-power of two number of row decoders and planes may be some other number such as, for example, five, six, seven, nine, etc. Also, it will be understood that, for the NAND flash device of the illustrated example embodiment, the total number of word lines 620 is 3n (where n is the total number of word lines per plane) and thus the total number of word lines is non-power of two number because of the multiplication factor (three) being a non-power of two number. Because the total number of word lines is non-power of two number, a memory device fabricated in accordance with the illustrated example embodiment should have a capacity that is non-power of two as can be shown by capacity calculations which can be easily carried out by those skilled in the art.

Still with reference to the example embodiment illustrated in FIG. 6, from a chip area usage standpoint, the difference in dimensions of peripheral circuit area 640 relative to the peripheral circuit area 134 (FIG. 1) is noteworthy. The length of the peripheral circuit area 640 (as measured from one input/output pads area to the other) is larger than that of the peripheral circuit area 134. Also, the opposite dimension of the peripheral circuit area 640 is smaller than the corresponding dimension of the peripheral circuit area 134. Analogizing to pizza dough or a pancake, the peripheral circuit area has been flattened (squeezed) down.

Figure 7:
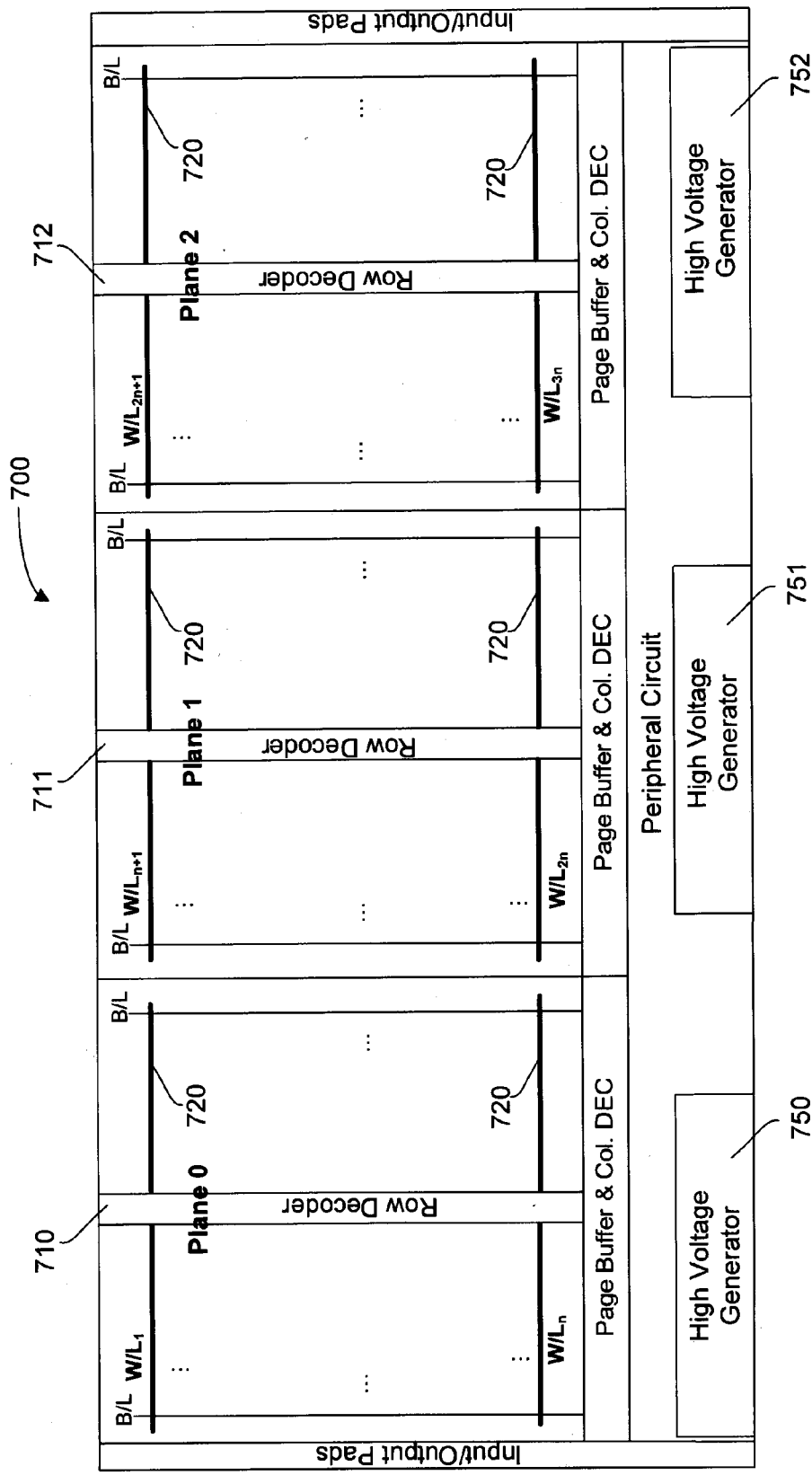
FIG. 7 is a block diagram of an example floor plan for a NAND flash chip fabricated in accordance with yet another example embodiment.

Reference will now be made to FIG. 7 which is a block diagram of an example floor plan 700 for a NAND flash chip fabricated in accordance with yet another example embodiment. Again there are three row decoders 710-712 shown in the illustrated example embodiment, one for each of the planes labeled Plane 0, Plane 1 and Plane 2. Likewise, the total number of word lines 720 is 3n (where n is the total number of word lines per plane) and thus the total number of word lines is non-power of two number because of the multiplication factor (three) being a non-power of two number. The primary difference between the example embodiment of FIG. 7 and the example embodiment of FIG. 6 is the presence of three high voltage generator areas 750-752 versus two high voltage generator areas 650-651. Thus, there is an additional high voltage generator in the example embodiment of FIG. 7 as compared to the example embodiment of FIG. 6. Because of the additional high voltage generator, those skilled in the art will appreciate that such a design may be chosen over the other design with less voltage generators in certain instances, such as when the benefit of the higher performance achieved in relation to memory device operations over the other design outweighs less efficient chip area usage as measured in terms of chip area which contains the memory cells relative to the total chip area. For many applications, higher currents for both $V_{cc}$ and $V_{pp}$ may be expected in conjunction with example embodiment of FIG. 7; however these higher currents should not be so sizable as to be of significant concern.

Other combinations of number planes and number of high voltage generators are contemplated. For example, five planes and three, four or five high voltage generators, six planes and four, five or six high voltage generators, etc.

It will be understood that in going from a power of two memory capacity device to a higher capacity non-power of two memory capacity device, an increase in address length by at least one bit is to be expected. As an example, say addresses of 24 bits in length are employed in a first memory device having power of two memory capacity, then for a second memory device having a memory capacity that is non-power of two and larger than the first device, it would be expected that addresses would be at least 25 bits in length.

In connection with a power of two memory capacity device it is theoretically possible (though not in actuality because of, for example, mapping out of bad cells) for each and every logical address to correspond to a valid physical address. For a non-power of two memory capacity device however, this cannot be the case. Because logical addresses are binary, the total count of all possible logical addresses will be a number that is some power of two. So, for example, it would be expected that for a 24 GB (non-power of two) capacity memory device, roughly 32 billion would be the total count of all possible logical addresses, meaning roughly 8 billion or more logical addresses would not have a corresponding valid physical address. Nevertheless, mapping out of invalid physical addresses can be taken care on the controller side by the file/memory management submodule 330 shown in FIG. 3, in a manner analogous to the mapping out of bad cells as understood by those skilled in the art.

Figure 8:
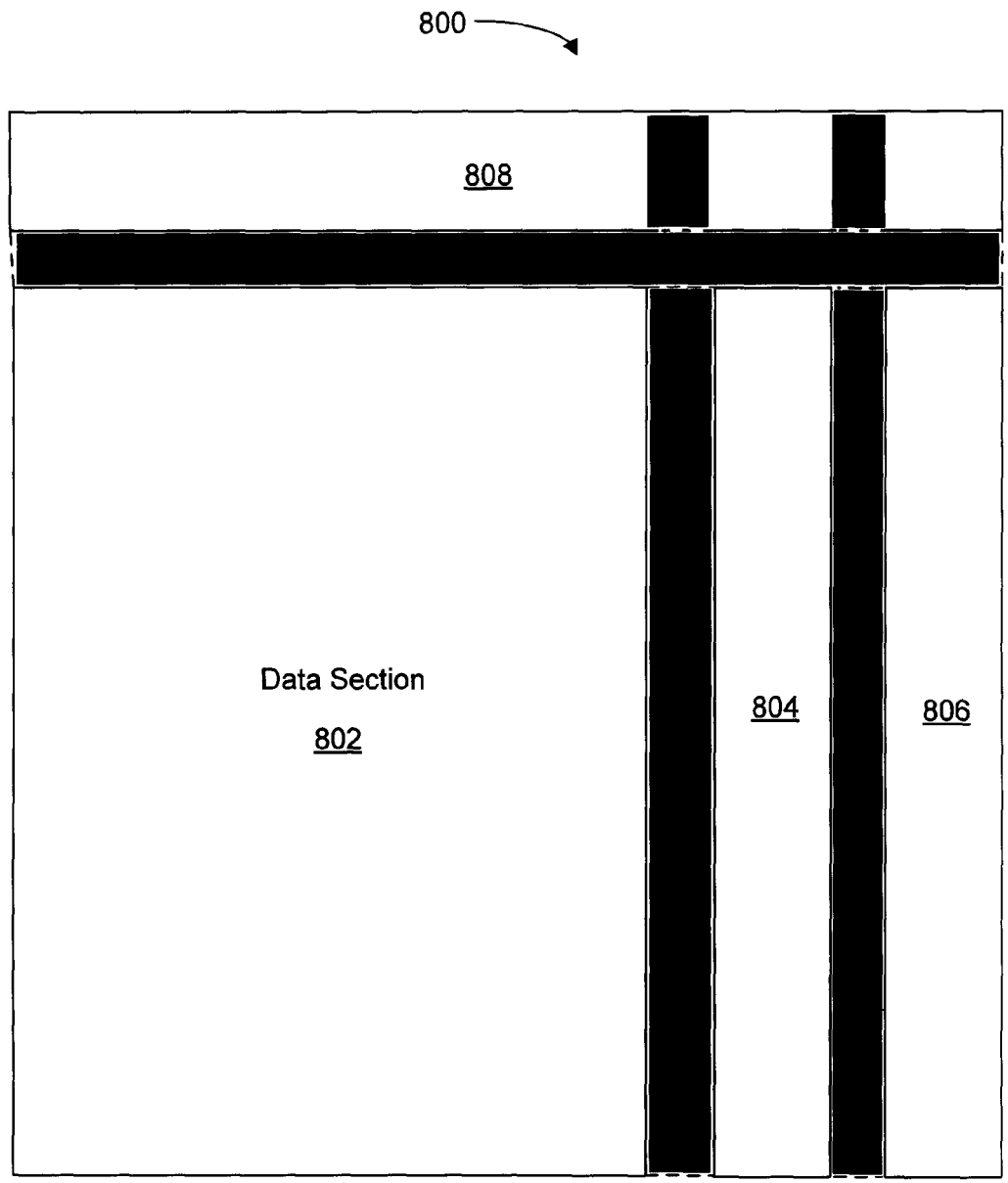
FIG. 8 is a block diagram of an example plane of a NAND flash chip, the diagram illustrating redundant and other sections of the plane.

It will be understood that the term "capacity" as used herein is capacity exclusive of non-data capacity or substitution capacity. In this regard, FIG. 8 is a block diagram of an example plane 800 of a NAND flash chip, and the diagram has been included in the drawings to explicitly clarify data capacity distinct from non-data capacity (or substitution capacity). The illustrated example plane 800 comprises four sections: a data section 802, a spare fields section 804, a redundant column(s) section 806, and a redundant block(s) section 808 (it should be noted that in alternative examples the plane may not have the redundant column(s) section 806, or it may not have the redundant block(s) section 808, or it may not have either the section 806, 808, or even still there may be some other type of secondary section that has a similar relevant purpose to the secondary sections presently described). The spare fields section 804 is a section of the plane 800 which corresponds to the spare fields of memory pages as previously explained. It will be understood that the spare fields section 804 has an associated non-data capacity. The redundant column(s) section 806 is a section of the plane 800 which corresponds to redundant column(s) of the plane 800 that in cases where defects arise can function as substitute columns for columns within the data section 802. It will be understood that the redundant column(s) section 806 has an associated substitution capacity. The redundant block(s) section 808 is a section of the plane 800 which corresponds to redundant block(s) which serve a similar purpose as redundant column(s) within the redundant column(s) section 806. It will be understood that the redundant block(s) section 808 has an associated substitution capacity. The remaining section is the data section 802. In conventional NAND flash the following holds: 1) the data section 802 has a power of two capacity; and 2) the data fields within the data section 802, which are the portions of pages exclusive of spare fields, have a power of two capacity.

Some example embodiments described herein relate to nonvolatile memory systems having non-power of two memory capacity without regard to specific applications within which the nonvolatile memory systems may be employed. Other example embodiments described herein relate to the use of nonvolatile memory systems having non-power of two memory capacity in specific applications, or the replacement of nonvolatile memory systems, that are employed in certain larger systems or products and that would conventionally have power of two memory capacity, with nonvolatile memory systems having non-power of two memory capacity.

Figure 9:
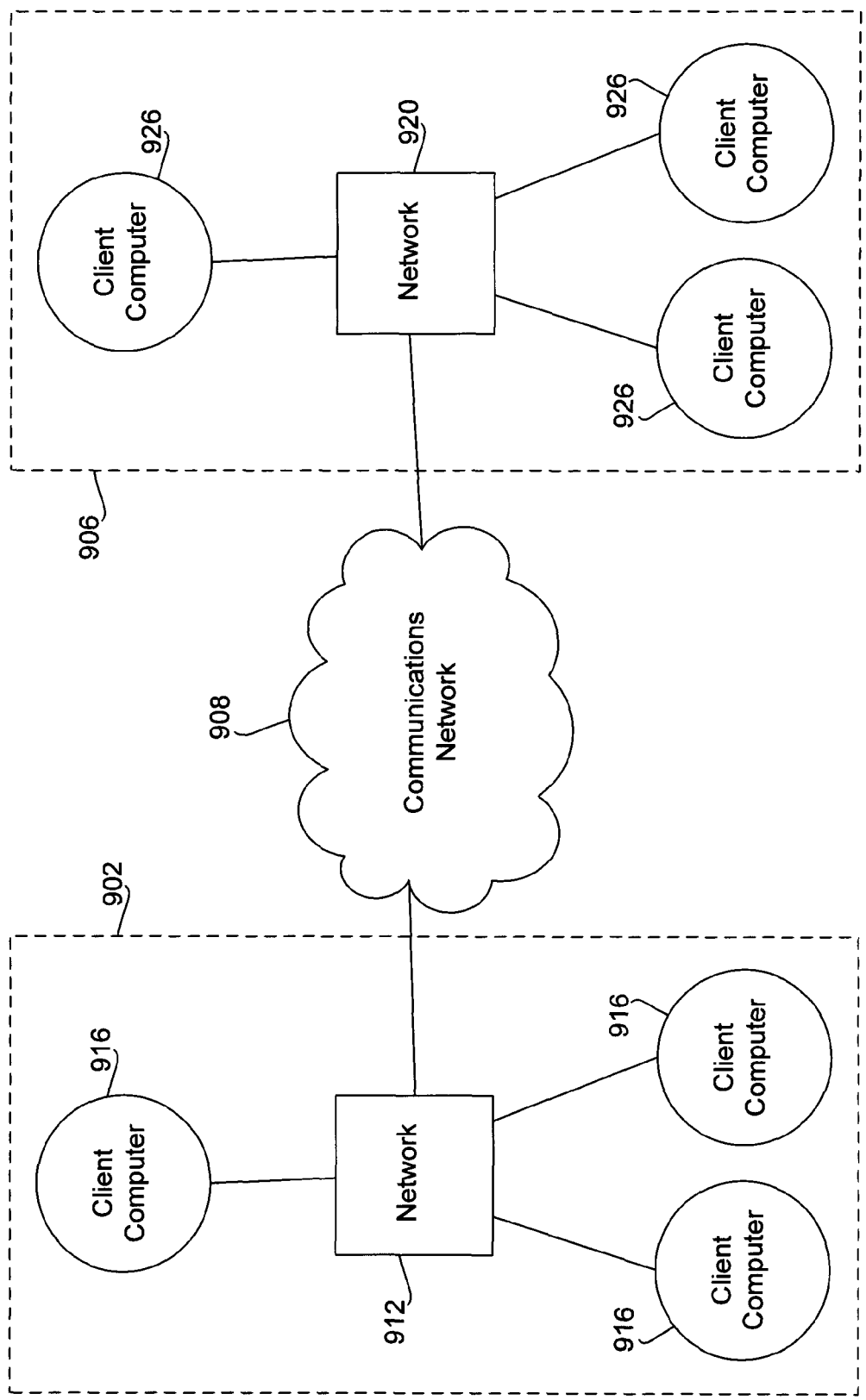
FIG. 9 is a block diagram of a communications arrangement between a memory device manufacturing company and a customer company.

Reference will now be made to FIG. 9. Shown is a block diagram of a communications arrangement between a memory device manufacturing company and a customer company. The customer company has computer systems 902 which communicate with computer systems 906 of the memory device manufacturing company over a communications network 908 (for example, the Internet).

As for the computer systems 902 of the customer company, these include a network 912 and a plurality of client computers 916. The network 912 may include any suitable combination of Local Area Networks (LANs), Virtual Private Networks (VPNs), servers, data stores (for example, databases), etc. Each of the client computers 916 may comprise a personal computer, mobile computing device, smartphone, or other computer capable of transmitting and receiving communications as facilitated by at least the network 912.

Similarly for the computer systems 906 of the memory device manufacturing company, these include a network 920 and a plurality of client computers 926. The network 920 may include any suitable combination of Local Area Networks (LANs), Virtual Private Networks (VPNs), servers, data stores (for example, databases), etc. Each of the client computers 926 may comprise a personal computer, mobile computing device, smartphone, or other computer capable of transmitting and receiving communications as facilitated by at least the network 920.

In some examples, the manufacturing company running the computer systems 906 is in the business of manufacturing memory chips, memory systems, etc. that are integrated into larger products manufactured, assembled or otherwise produced by the customer company that runs the computer systems 902. As one example, the customer company may purchase flash memory chips from the manufacturing company which it then uses in the production of a portable media player. As yet another example, the customer company may purchase flash memory chips from the manufacturing company which it then uses in the production of a wirelessly enabled phone.

In some examples, the hardware used in implementing the previously described computer systems 902, 906 and the communications network 908 is conventional. However, in accordance with an example embodiment, there is provided a novel method of ordering memory devices carried out within the communications arrangement of FIG. 9. This method will be described in greater detail following a description below of an alternative communications arrangement.

Figure 10:
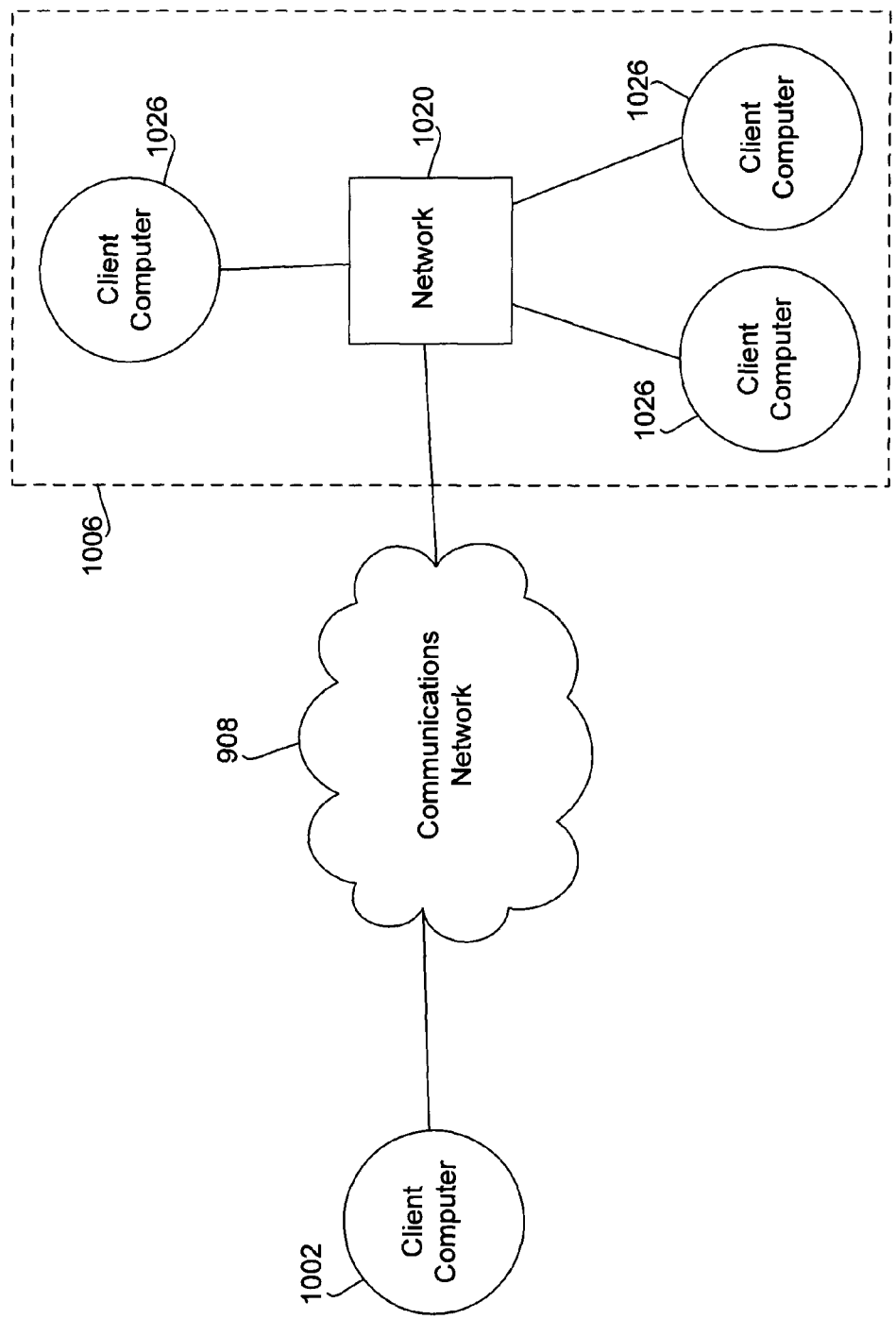
FIG. 10 is a block diagram of a communications arrangement between a customer and a company selling memory products.

Reference will now be made to FIG. 10. Shown is a block diagram of a communications arrangement between a customer and a company selling memory products such as, for example, a memory stick, Secure Digital (SD) flash card, Solid State Drive (SSD), etc. Also, in some cases the nonvolatile media being sold will be blank; however in other cases content will be included on the nonvolatile media. For instance, the company may be selling, for example, a nonvolatile memory game cartridge, or a flash memory card with pre-installed mobile device application(s). The sale of a larger product that includes the memory product is also contemplated. For instance, the company may be selling, for example, an MP3 player that includes a flash card, a cell phone that includes a flash card, a desktop/mobile computer that includes an SSD, etc.

Still with reference to FIG. 2, the customer has a client computer 1002 which communicates with computer systems 1006 of the memory products company over the communications network 908 (for example, the Internet). Also, it will be understood that the client computer 1002 may comprise a personal computer, mobile computing device, smartphone, or other computer capable of transmitting and receiving communications as facilitated by at least the communications network 908.

As for the computer systems 1006 of the memory products company, these include a network 1020 and a plurality of client computers 1026. The network 1020 may include any suitable combination of Local Area Networks (LANs), Virtual Private Networks (VPNs), servers, data stores (for example, databases), etc. Each of the client computers 1026 may comprise a personal computer, mobile computing device, smartphone, or other computer capable of transmitting and receiving communications as facilitated by at least the network 1020.

When the network 920 or 1020 includes a server, those skilled in the art will appreciate that such a server will typically be capable of sending and receiving communications that are transmitted through the Internet. In accordance with some example embodiments, the server is capable of receiving data which includes information corresponding to an order for at least one item (as will be described in further detail subsequently). In those example embodiments, the server is also capable of processing the data to make the data suitable for storage in an at least one data store. Those skilled in the art will understand how the data needs to be made suitable for storage. As just one simple example, the data received at the server may include part(s) that are not stored in the at least one data store. For instance, the data may include one or more encryption parts present in the data to ensure security during transmission over the Internet. Such encryption part(s) may be processed out by the server.

It will be understood that variations on communications arrangements beyond those described in connection with FIGS. 9 and 10 are contemplated. For instance, as a variation from what is shown in FIG. 10, a person (customer) might not be operating his client computer 1002 from his home where a customer-side network similar to the network 912 (FIG. 9) may not be present. Instead, the person might be using a computer in his office, in an Internet café, or using a mobile computer in a WiFi hot spot of a public area such as an airport, etc. In such circumstances, a customer-side network similar to the network 912 may exist.

Figure 11:
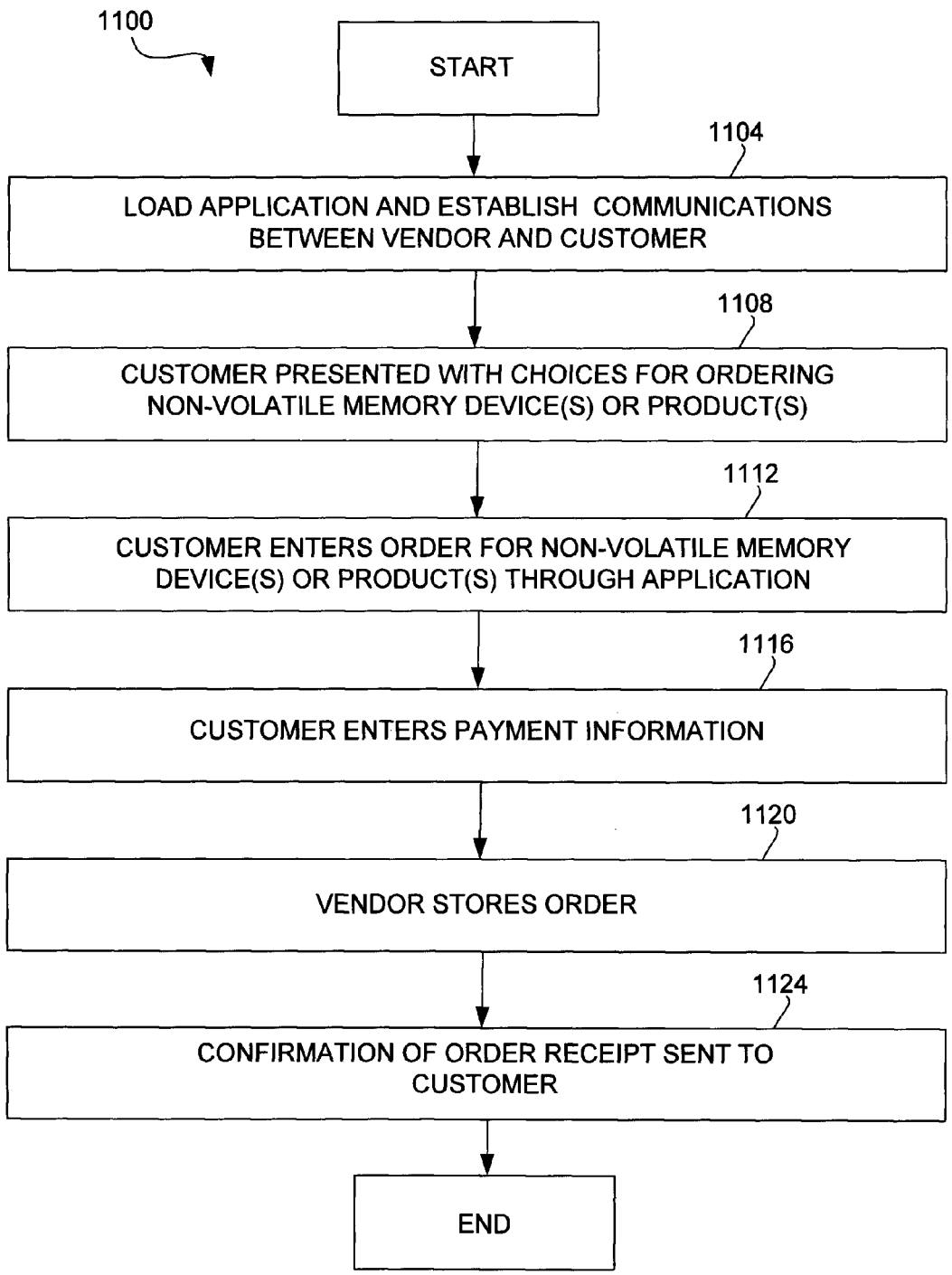
FIG. 11 is a flow chart of a method for ordering memory devices or memory products in accordance with some example embodiments.

Reference will now be made to FIG. 11, which is a flow chart of a method 1100 for ordering memory devices or memory products in accordance with some example embodiments. The method 1100 is described from "START" to "END" below, taking into account that some variance from the illustrated actions is contemplated. For example, in some instances some of the actions may occur in an order different than the illustrated order. Also, any reference to "customer" in the description below is in the broad sense of the term including, for example, a customer company in the context of an example corresponding to FIG. 9, or a person in the context of an example corresponding to FIG. 10. Similarly, any reference to "vendor" in the description below is in the broad sense of the term including, for example, a memory device manufacturing company in the context of an example corresponding to FIG. 9, or a memory products company in the context of an example corresponding to FIG. 10.

At action 1104 which is shown immediately after "START", a customer loads an application on the client computer 916 (FIG. 9) or the client computer 1002 (FIG. 10). In some examples, the application may be an Internet browser-based application (for example, Microsoft's Internet Explorer®) but in other examples the application may take some other form including applications which do not require loading an Internet browser. Also at the action 1104, communications are established between the client computer and the network of the vendor. As an example in this regard, a form-based Graphical User Interface (GUI), constructed from information stored on a network server of the vendor, may appear on the display of the customer's computer.

At action 1108, the customer is presented (visually through a display screen, or through other means) with choices as to which items, namely nonvolatile memory device(s) or nonvolatile memory product(s) he wishes to order. In accordance with some examples, this is achieved by way of an interactive fillable form presented on a display screen.

Figure 12:
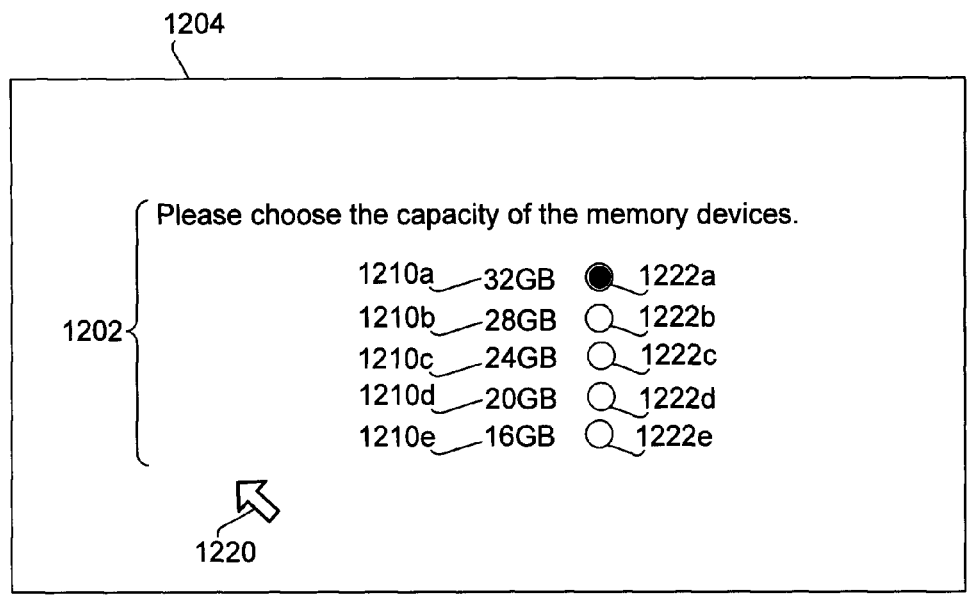
FIG. 12 shows a portion of an example Graphical User Interface (GUI) in accordance with an example embodiment.

Referring to FIG. 12, a portion 1202 of one possible fillable form is shown on display screen 1204. (It should be understood that fillable order forms typically provide for the entry of at least several order details, and that even though there is presently shown only a portion of a form with respect to one detail of an order, this is simply for convenience of illustration.)

Still with reference to FIG. 12, it will be evident from the request, "please choose the capacity of the memory devices," that the customer needs to enter, as a part of his order, the detail as to what capacity of memory device(s) he wants. In the illustrated example, the customer has five choices 1210*a*-1210*e* as to the capacity of memory device(s) he wants. Choices 1210*a* and 1210*e* are the power of two capacities. Choices 1210*b*, 1210*c* and 1210*d* are the non-power of two capacities.

Referring now to FIG. 11, at action 1112 in the illustrated ordering method, the customer enters his order for the nonvolatile memory device(s) or nonvolatile memory product(s). In the illustrated example GUI of FIG. 12, the action 1112 involves completing the fillable form. As a part of this process, the customer can move cursor 1220 over one of the radio buttons 1222*a*-1222*e* (each of which correspond to a respective one of the choices 1210*a*-1210*e*) and select it. The customer could then move the cursor 1220 to other portions of the fillable form to enter additional details concerning his order. As mentioned, fillable order forms typically provide for the entry of at least several order details. As just one example of another possible order detail, the customer may be able to enter the number of nonvolatile memory device(s) or nonvolatile memory product(s) that he wishes to order. In this regard, a company customer may be more likely to order a relatively large number of device(s)/product(s), whereas an individual customer may be more likely to order a relatively small number of device(s)/product(s).

Figure 13:
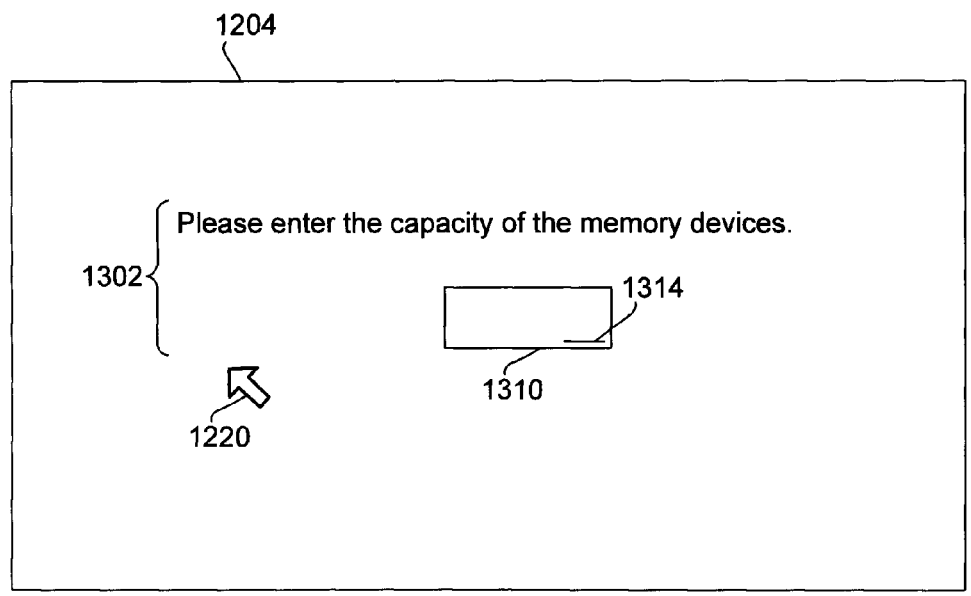
FIG. 13 shows a portion of another example GUI in accordance with an another example embodiment.

Although the detail entered in the example of FIG. 12 is by way of radio buttons, though skilled in the art of GUI design will appreciate that various alternatives to radio buttons exist for entering the same or a similar detail. FIG. 13 illustrates one such alternative.

In FIG. 13, a portion 1302 of an alternative fillable form is shown on display screen 1204. Again, the customer needs to enter, as a part of his order, the detail as to what capacity of memory device(s) he wants. In the illustrated example, the customer types in the capacity within text field 1310 at cursor 1314. Optionally, the GUI may include interactive logic to verify, concurrently as the detail is being typed in, that the capacity entered is a valid entry (i.e. memory device or devices matching the capacity desired by the customer are available for purchase). A notification such as, for example, a few words of text near the text field 1310, may appear in the case where the capacity entered is not a valid entry.

Beyond the differences described above, the example of FIG. 13 may be otherwise similar to the example of FIG. 12. For instance, after the customer is finished entering the capacity detail within the text field 1310, the customer could then move the cursor 1220 to other portions of the fillable form to enter additional details concerning his order.

Not all example embodiments are limited to order entry through a GUI. In fact, it is contemplated that the customer may not even need to look at a display screen at all. In at least one example embodiment, the customer is able to enter his order through a phone service-type application of the kind in which customer input is accepted by way of Dual-tone multi-frequency (DTMF) signaling generated by use of a touch tone keypad in response to voice prompts. In such an example embodiment, the details of the order would be entered one-by-one after successive voice prompts. (This type of ordering is known to exist in other contexts such as, for example, stock ordering and home shopping ordering.) Other alternative example embodiments are also contemplated.

Reference will now be made again to FIG. 11 and, in particular, to the next illustrated action in the flow chart after the action 1112, which is action 1116. At this action, the customer enters payment information. In some examples, the customer may pay by credit card by entering, for example, his credit card number and expiry date into fields of the GUI. In other examples, the customer may pay by using some other form of payment such as, for example, PayPal™. Alternative variations are contemplated. For example, it may not be necessary for the customer to enter his credit card information if the vendor's computer system has some way of retrieving this by way of association with the customer's identity. See for instance U.S. Pat. No. 5,960,411 of Hartman et al. (the so called "One-Click" patent). As another example, the customer might not make payment at the point of purchase. For instance, the customer might be later invoiced with instructions for making subsequent payment within a period of time from the invoice date.

At action 1120, the necessary information to complete the order has been obtained, and thus the order is stored for later processing. Specifically, the order will typically be stored in suitable storage within the vendor's computer system. This suitable storage may take the form of a database on a computer readable medium; however other forms of suitable storage may be possible as understood by those skilled in the art.

At action 1124, a confirmation of the order is sent to the customer. Typically, the confirmation will take the form of one or more electronic notification(s) sent to the customer. Examples of electronic notification(s) include, for example, an e-mail message, a text message, a browser page displayable to the customer, etc. Referring to FIGS. 9 and 10, an electronic notification confirming receipt of the order is, in some instances, generated by a server within the network 920 or 1020 for immediate or eventual receipt by the client computer 916 or 1002 respectively, after transmission through the communications network 908.

Figure 14:
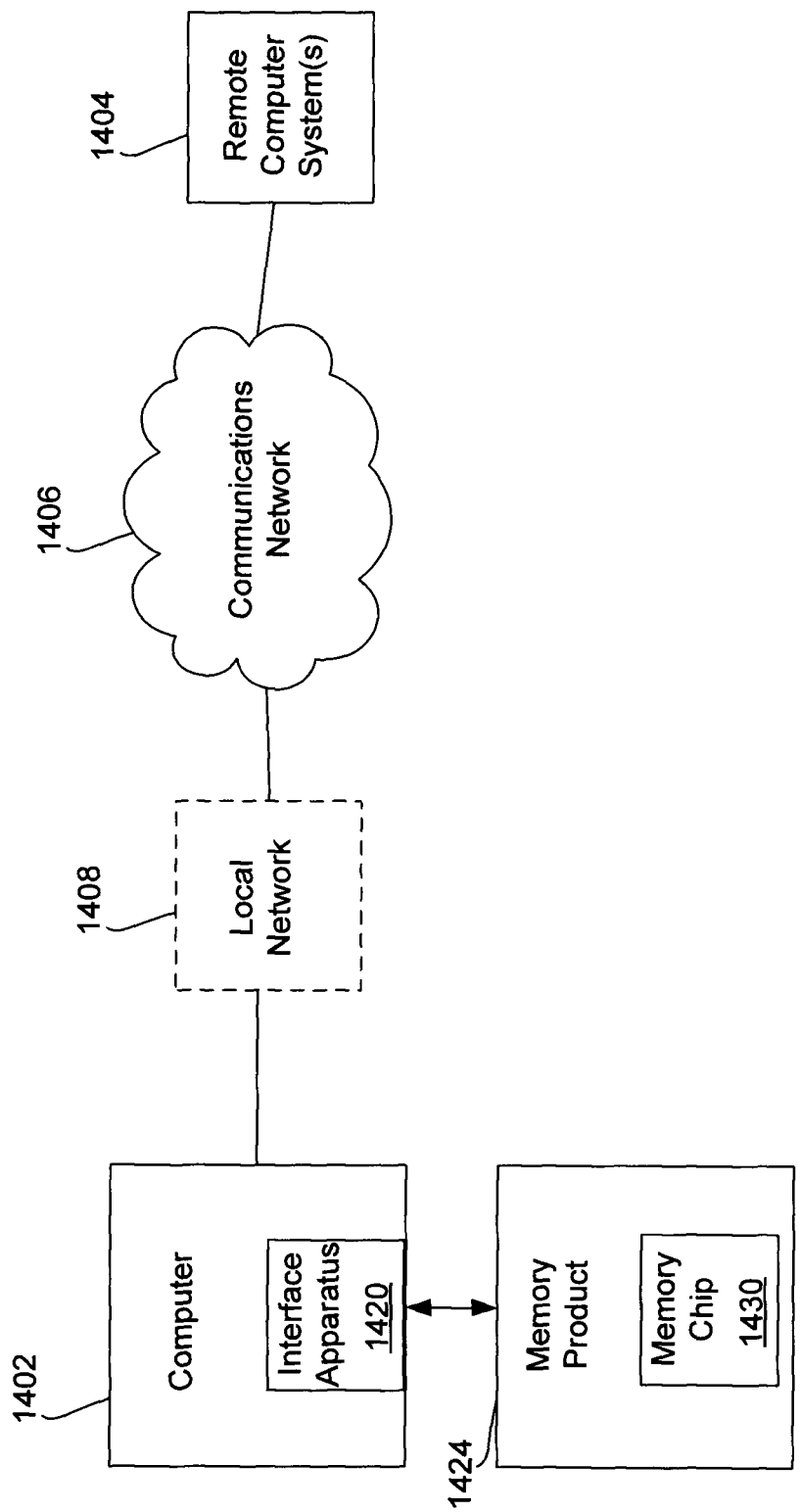
FIG. 14 is a block diagram of a communications arrangement facilitating nonvolatile memory media update in accordance with some example embodiments.

Reference will now be made to FIG. 14, which is a block diagram of a communications arrangement facilitating nonvolatile memory media update in accordance with some example embodiments. In this diagram, a computer 1402 can communicate with remote computer system(s) 1404 via the communications network 1406 (for example, the Internet). Alternatively, the computer 1402 can communicate with the remote computer system(s) 1404 via both a local network 1408 and the communications network 1406.

With respect to the computer 1402, this may comprise (whether individually or in combination with one or more other communicatively linked computers 1402) a personal computer, mobile computing device, mobile Global Positioning System (GPS) device, smartphone, mobile (handheld) gaming system, non-mobile gaming system, or other computer capable of transmitting and receiving communications as facilitated by at least the communications network 1406. The computer 1402 includes an interface apparatus 1420 which permits the computer 1402 to communicatively interface with a memory product 1424. A non-exhaustive list of example possible interface apparatuses includes Universal Serial Bus (USB) ports, flash card readers, cartridge readers, Ethernet ports, Wi-fi transceivers, etc., or any suitable combination of these. With respect to the memory product 1424, examples include a nonvolatile memory stick, a flash card, a nonvolatile memory game cartridge, a proprietary nonvolatile memory device, a Solid State Drive (SSD), etc.

The illustrated memory product 1424 includes at least one nonvolatile memory chip 1430 having a non-power of two capacity. In accordance with some example embodiments, pre-installed on the memory chip 1430 is a significant quantity of files (data and/or computer readable instructions) that takes up some, but not all the capacity of the memory chip 1430 (what is meant by "pre-installed" is stored on the memory chip 1430 either at or before sale of the memory product 1424 to the product user, or stored on the memory chip 1430 at some point during the stages of manufacture, assembly and packaging of the memory product 1424). The files stored on the memory chip 1430 will typically comprise software code. As one example hereinafter referred to as example number one, if the computer 1402 includes a mobile GPS device, a GPS application and/or road maps might be stored on the memory chip 1430. As another example hereinafter referred to as example number two, if the computer 1402 includes a gaming system, a video game might be stored on the memory chip 1430. Other similar examples are contemplated.

Still with respect to the above-described example embodiments, conveniently the user of the memory product 1424 may improve it by using the computer 1402 to download additional file(s) from the remote computer system(s) for storage on one or more of the nonvolatile memory chips 1430 having non-power of two capacity. With reference again to example number one, the additional file(s) might be, for instance, additional road maps. In terms of example number two, the additional file(s) might be, for instance, additional levels in the video game. Also, it is possible, in accordance with at least one example embodiment, for one or all of the additional file(s) to be stored on the same memory chip 1430 that stores the pre-installed files because, as mentioned previously, the pre-installed files do not take up all of the capacity of the memory chip 1430. Additionally, because the memory chip 1430 is flexibly sized in that it need not be selected from amongst only those memory chips that have a power of two capacity, it is contemplated that in various instances the producer (authors) of the applications and files that are to be stored on the memory chip 1430 is less constrained in terms of trying to optimize the size of the applications and files for a power of two capacity memory chip.

Certain adaptations and modifications of the described embodiments can be made. Therefore, the above discussed embodiments are considered to be illustrative and not restrictive.

What is claimed is:

1. Apparatus comprising a nonvolatile memory chip, the memory chip including:
    a non-power of two number of planes greater than two, said number of planes each including a plurality of blocks with each said blocks divided into a number of pages and each said blocks defined along a first dimension by a first number of memory cells for storing data, and along a second dimension by a second number of memory cells for storing data, the memory chip having a non-power of two capacity; and
    a plurality of row decoders, each of said row decoders being configured to facilitate a read operation on an associated page of the memory chip.

2. The apparatus as claimed in claim 1 wherein said plurality of row decoders is a non-power of two number of row decoders.

3. The apparatus as claimed in claim 1 wherein the apparatus is configured for connection to a Universal Serial Bus port, and wherein the memory chip stores pre-installed files that take up less than all of the capacity of the memory chip.

4. The apparatus as claimed in claim 1 further comprising a number of high voltage generators, less than the number of the planes, for providing voltages needed during operations of the memory chip including said read operation.

5. The apparatus as claimed in claim 1 further comprising a number of high voltage generators, equal to the number of the planes, for providing voltages needed during operations of the memory chip including said read operation.

6. The apparatus as claimed in claim 1 wherein the memory chip is a flash memory chip.

7. The apparatus as claimed in claim 1 wherein the memory chip is a NAND flash memory chip.

8. A memory system comprising:
    at least one nonvolatile memory device that has at least one plane, said plane including a plurality of blocks with each said blocks divided into a number of pages and each said blocks defined along a first dimension by a first number of memory cells for storing data, and along a second dimension by a second number of memory cells for storing data, said memory device having a non-power of two capacity proportionally related to a total number of memory cells in a data section of said plane; and
    a memory controller in communication with said memory device, said memory controller including storage and a management module, said storage storing a map table, said management module configured to access the map table to carry out translation of logical addresses to physical addresses, and invalid physical addresses attributable to the non-power of two capacity of said memory device being mapped out in the map table.

9. The memory system as claimed in claim 8 wherein said memory device includes a plurality of row decoders, and an at least substantially one-to-one relationship exists, in the memory device, for number of row decoders to number of pages, and each said row decoders being configured to facilitate a read operation on an associated page of the memory device.

10. The memory system as claimed in claim 9 wherein said plurality of row decoders is a non-power of two number of row decoders.

11. The memory system as claimed in claim 8 wherein said at least one plane is more than two planes.

12. The memory system as claimed in claim 11 wherein said memory device includes a number of high voltage generators, less than the number of the planes, for providing voltages needed during read and other operations of the memory device.

13. The memory system as claimed in claim 11 wherein said more than two planes is a non-power of two number of planes.

14. The memory system as claimed in claim 8 wherein said memory device is a NAND flash memory device, said storage is Static Random Access Memory (SRAM) and said management module includes an allocator for handling translation of logical addresses to physical addresses in accordance with NAND Flash Translation Layer (NFTL).

15. The memory system as claimed in claim 8 wherein said memory device is a flash memory device.

16. A method of filling a memory controller table with data, the table stored in a random access memory of a memory controller, the memory controller in communication with a memory chip having at least one memory cell array storing the data for management functions of the memory controller, the method comprising:
    retrieving the data from the at least one memory cell array of the memory chip, the at least one memory cell array of the memory chip having a non-power of two capacity;
    processing the data in the memory controller to determine invalid physical addresses attributable to the non-power of two capacity of the at least one memory cell array of the memory chip; and
    modifying the memory controller table to map out said invalid physical addresses.

17. The method as claimed in claim 16 wherein the at least one memory cell array of the memory chip is a number of memory cell arrays greater than two, said number greater than two being a non-power power of two number.

18. The method as claimed in claim 16 further comprising modifying the same memory controller table to map out bad memory cells.

19. The method as claimed in claim 16 wherein the data is retrieved from spare fields of pages of the at least one memory cell array of the memory chip.

* * * * *